United States Patent [19]
Scott

[11] Patent Number: 5,745,011
[45] Date of Patent: Apr. 28, 1998

[54] DATA RECOVERY PHASE LOCKED LOOP

[75] Inventor: Paul H. Scott, San Jose, Calif.

[73] Assignee: Cypress Semiconductor Corporation, San Jose, Calif.

[21] Appl. No.: 658,760

[22] Filed: Jun. 5, 1996

[51] Int. Cl.$^6$ .............................. H03L 7/085; H03L 7/093
[52] U.S. Cl. .................. 331/44; 331/14; 331/17; 327/156
[58] Field of Search ..................... 331/44, DIG. 2, 331/17, 11, 14; 327/160

[56] References Cited

U.S. PATENT DOCUMENTS

| | | | |
|---|---|---|---|
| 4,943,788 | 7/1990 | Laws et al. | 331/11 |
| 5,015,970 | 5/1991 | Williams et al. | 331/11 |
| 5,072,195 | 12/1991 | Graham et al. | 331/2 |
| 5,525,935 | 6/1996 | Joo et al. | 331/11 |

*Primary Examiner*—Timothy P. Callahan
*Assistant Examiner*—An T. Luu
*Attorney, Agent, or Firm*—Bliss McGlynn, P.C.

[57] ABSTRACT

A clock recovery phase locked loop system is described. One embodiment has a voltage controlled oscillator divider (the signal of which is compared with a REFCLK divider signal), a voltage stimulus input where a test voltage is applied, a time stimulus input where a digital input with appropriate pulse width is applied and a monitor (output) where the results of the measurement can be observed. A test system is included which applies a series of analog voltages to the voltage stimulus input. For each analog voltage, the test system apply a series of pulses to the time stimulus input. By monitoring (a) the level on the monitor output and (b) the time at which it switches, the VCO gain can be calculated. This allows a direct measurement of VCO gain ($K_v$) using conventional automatic test equipment used to test digital logic or memory devices.

13 Claims, 2 Drawing Sheets

1

DATA RECOVERY PHASE LOCKED LOOP

FIELD OF THE INVENTION

The present invention pertains to phase locked loop circuits and more particularly to phase locked loops and circuitry to measure internal parameters and to adjust for process variations.

BACKGROUND OF THE INVENTION

FIG. 1 is a block diagram illustrating a typical data recovery phase locked loop. A phase detector 12 receives two inputs, a data input at node 14 and a voltage controlled oscillator input at node 16. Phase detector 12 provides two inputs to filter 18, which provides the input to voltage controlled oscillator 20. A bit clock signal aligned with the incoming data signal is provided as an output by voltage controlled oscillator 20.

Phase detector 12 measures the difference between the transitions in the data-input at node 14 and the voltage controlled oscillator feedback at node 16 and creates an error indication input suitable for use by filter 18 under certain conditions.

Filter 18 converts these quantified error indications into a continuous voltage suitable for controlling voltage controlled oscillator (VCO) 20. In the example illustrated in FIG. 1, the control is generally an analog voltage. Voltage controlled oscillator 20 responds to the input levels by quickly, almost instantaneously, changing its frequency to correspond to the level present on its input.

In most embedded phase locked loop designs, various gain and transfer parameters are set for optimum performance. However, these parameters must be compromised to account for normal parametric variations that arise during the normal course of semiconductor processing.

In older designs, two uncontrolled variations (movement within the cutoff and saturation regions and gain change within the operational range) have been accommodated by designing an oscillator with the widest possible frequency range and then using only a small part of the total theoretical range. In some wide frequency range applications, external controls compensate for the variation in gain.

Design of compensation circuits to account for process and environmental variation generally consume most design time and cause most circuit and testing complications.

Previous designs have two significant disadvantages based on a need to compensate for unknown parametric variations that cannot be easily measured or determined. First, highest performance operation is compromised to compensate for parametric shifts. The product must be over-designed, and the excess performance cannot be relied upon in the target specification, since the exact performance of any specific part cannot be predicted or guaranteed. Second, designers generally allow for less than the full parametric variation range to assure that the product performs as the data sheet describes. This again results in over designing the circuit and using components having capacities much greater than actually required.

SUMMARY OF THE INVENTION

The present invention provides a method and apparatus to measure internal phase locked loop (PLL) parameters and to adjust for process variations that would otherwise cause yield loss or impaired performance. The present invention also provides a method that can be used to measure the actual performance of some of these variations.

The present invention also concerns a method and apparatus that allows post processing alterations to increase the yield or minimize the difficulty of testing for these variations. By providing a clock recovery phase locked loop system which may include additional logic that may account for the possibility that the voltage controlled oscillator could run at a harmonic of the incoming data, the present invention is able to compensate for a condition that is undetectable by phase detectors used in traditional data recovery loops.

In the normal operational mode of the present phase locked loop system, the feedback signal from the voltage controlled oscillator may be compared, for example, with the signal from REFCLK divider in the voltage controlled oscillator divider 60 to determine if the voltage controlled oscillator is running within allowable limits. If it is not, an "out of lock" (error) indication will be asserted. Logic circuits may then adjust the voltage controlled oscillator to the desired operating frequency. As long as the voltage controlled oscillator operates within acceptable limits, the out of lock indication is not asserted and the phase locked loop tracks the incoming data.

Access points in the present invention include a voltage stimulus input where a test voltage may be applied, a time stimulus input where a digital pulse having a predetermined pulse width may be presented and a monitor where the results of the measurement can be displayed/observed. This allows a direct measurement of VCO gain ($K_v$) using conventional (and preferably automatic) test equipment used to test digital logic or memory devices.

The present test system applies a series of analog voltages to the voltage stimulus input and, for each analog voltage, applies a series of pulses to the time stimulus input. By monitoring the level on the monitor output (or a signal resulting in the monitor output) and the time at which it switches, the VCO gain can be calculated.

DESCRIPTION OF THE PREFERRED EMBODIMENTS

Figure 2:
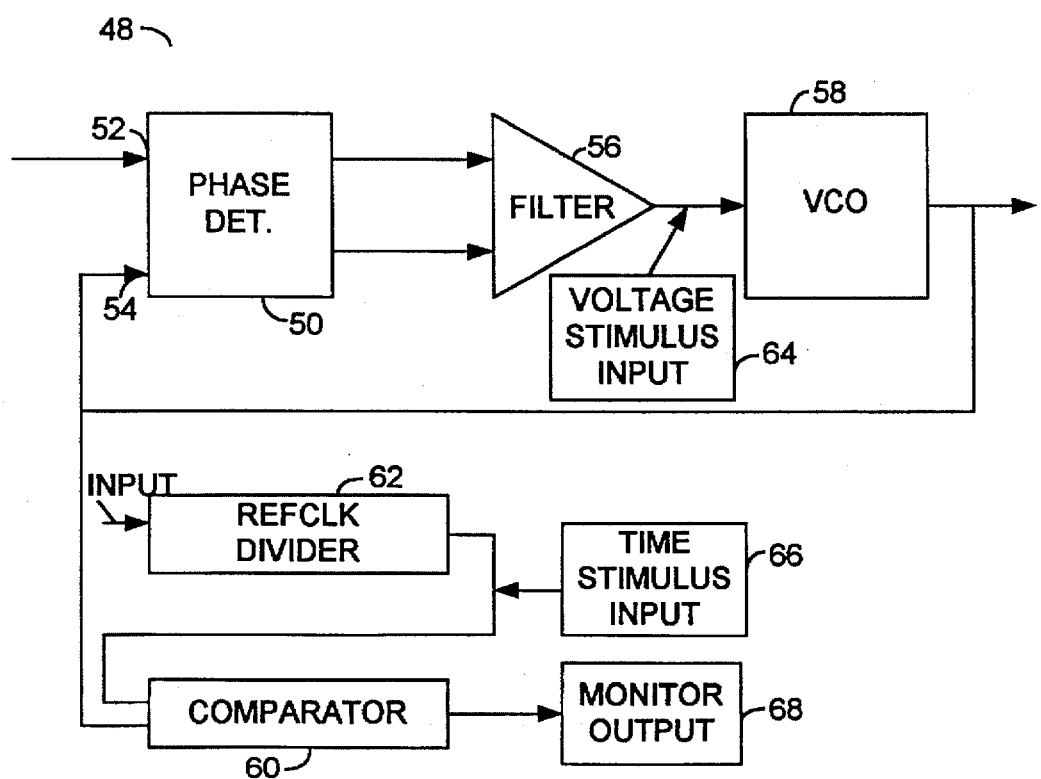
FIG. 2 is an exemplary block diagram of the present Clock Recovery Phase Locked Loop circuit.

The present invention concerns a method and apparatus to measure internal phase locked loop (PLL) parameters and to adjust for process variations that would otherwise cause yield loss or impaired performance. FIG. 2 illustrates an exemplary clock recovery phase locked loop system 48, having a phase detector 50 with inputs 52 and 54, a filter 56, a voltage controlled oscillator 58, and a voltage controlled oscillator divider 60 (e.g., a comparator) which compares the signal from voltage controlled oscillator 58 with a signal from a REFCLK divider 62. Clock recovery phase locked loop system 48 also has additional access points, a voltage stimulus input 64, a time stimulus input 66 and a monitor/output 68. Voltage stimulus input 64 may be the point where a test voltage is applied. Time stimulus input 66 may be the point where a digital (e.g., timing) input with an appropriate and/or predetermined pulse width is applied. Monitor output 68 may be the point where the results of the measurement are observed.

A test system is included which applies a series of analog voltages to voltage stimulus input 64. For each analog voltage, the test system may apply a series of pulses to the time stimulus input 66. By monitoring (a) the level on monitor/output 68 and (b) the time at which it switches, the gain of voltage controlled oscillator 58 can be calculated. This allows a direct measurement of VCO gain ($K_v$), using conventional (optionally automatic) test equipment used to test digital logic or memory devices.

Figure 3:
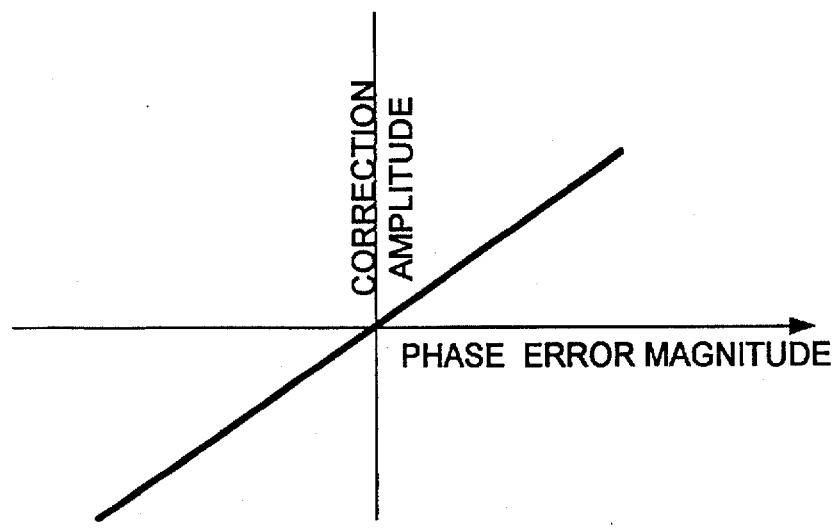
FIG. 3 is a graph generally depicting a relationship between Phase Error Magnitude and Correction Amplitude for the circuit of FIG. 2.

Phase detector 50, as with conventional phase locked loop circuits, measures the difference between the transitions in the incoming data-input 52 and the voltage controlled oscillator feedback input 54 and sends/provides an error indication suitable for use by the filter 56 when a certain condition is met. The error indication is typically a string of digital pump-up or pump-down pulses, but could also be an analog waveform. In either case, the amount of error indication that is produced for a given quantity of error is expressed as a phase detector gain, defined as the amplitude of the error pulse times the width of the pulses. If the amplitude remains fixed (a preferred condition in the present invention), the transfer function is a linear function of only the phase error magnitude. All corrections, from the smallest to the largest and from the earliest to the latest, will fall on a straight line, as illustrated in FIG. 3. As processing and environmental conditions change, the slope changes, but it should remain a straight line function if phase locked loop system 48 is to operate in accordance with the embodiment of the present invention in which the pump-up/pump-down pulse amplitudes are fixed.

Filter 56, again, as with conventional phase locked loop circuits, converts the quantified error indications from phase detector 50 into a continuous voltage suitable for controlling voltage controlled oscillator (VCO) 58. In the embodiment of the present invention illustrated in FIG. 2, the control is preferably an analog voltage. However, the control could be current information, digital information or any other information acceptable for use in a conventional and/or commercially available voltage to frequency converter (e.g., a current controlled oscillator or $CCO_1$, a digitally controlled oscillator or an $NCO_1$, etc.). The transfer function of filter 56 is usually expressed as a gain constant, $K_F$.

Figure 4:
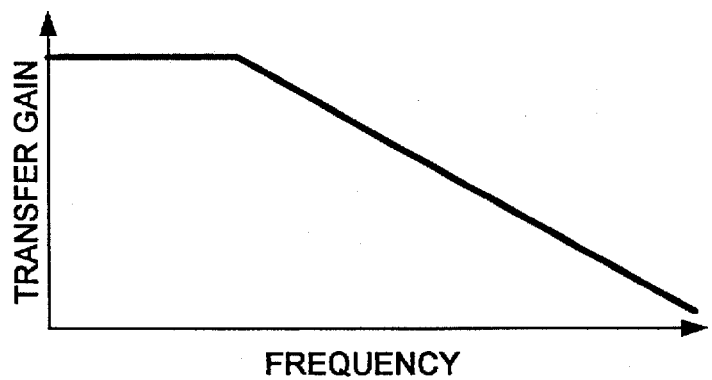
FIG. 4 is a graph showing a relationship between Frequency and Transfer Gain for the circuit of FIG. 2.

The Gain vs. Frequency plot of FIG. 4 illustrates the typical low pass area where signals pass relatively unattenuated and the critical frequency above which signals are linearly attenuated. The critical frequency and the overall attenuation are parameters that are determined by the phase locked loop functional requirements.

Filter 56 may take several forms. Typically, filter 56 is a charge pump feeding a low pass filter, or an amplifier having a low pass filter as part of the feedback circuit. In either case, the pulsed error inputs are changed to a DC average voltage with small superimposed AC correction voltages.

The absolute gain of either phase detector 50 or filter 56 is relatively simple to control. Each of them is amenable to normal circuit compensation techniques that are insensitive to the absolute frequency of their operation.

Voltage controlled oscillator 58 responds to the voltage input level by quickly, almost instantaneously changing frequency to correspond to the voltage level. The transfer function of this voltage to frequency conversion, illustrated in FIG. 5, is usually expressed as the Gain constant $K_v$.

Figure 5:
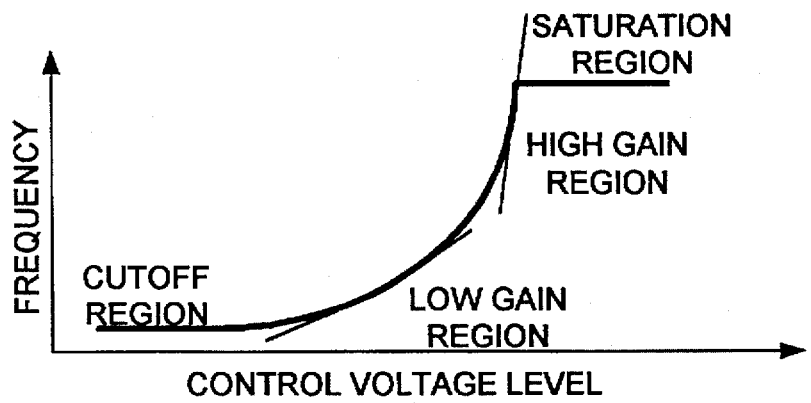
FIG. 5 is a graph showing a relationship between a Control Voltage Level and Frequency for the circuit of FIG. 2.

FIG. 5 illustrates a typical transfer curve for a typical voltage controlled oscillator which may be used in the present invention. As the control voltage moves over its operational range, the gain changes according to the relationship ($\Delta$ frequency out / $\Delta$ voltage in). When the control voltage is near its lowest possible value, near the cutoff region, the gain is the lowest. When the control voltage is near its highest possible value, near the saturation region, the gain is highest. Other transfer functions are possible, and this invention does not rely on the actual function or values of each block.

Actual values such as frequency, voltage, temperature, process corner, etc., of the cutoff region and the saturation region vary as a function of processing, temperature and applied power supply level. Also, within the operational control range, the gain may change as the frequency changes. At higher frequencies, closer to the saturation region, the gain may be higher when a unit of control voltage variation causes a larger frequency variation than the same unit of control voltage variation applied closer to the cutoff region. In conventional phase locked loop equations, $K_F$, $K_\phi$ and $K_v$ are constants and define the loop behavior. Conventional phase locked loop equations do not consider the possibility of a gain/frequency relationship as shown in FIG. 5.

The transfer function of the entire closed loop system is the sum of the individual block transfer functions or gains of phase detector 50, filter 56 and voltage controlled oscillator 58. Variations in any one can be used to compensate another within limited ranges. This characteristic can be used advantageously in the present invention.

The gain constants of phase detector 50, filter 56 and voltage controlled oscillator 58 are major parameters in the phase locked loop equations that define the performance of the final product. Each of the gain constants may be affected by normal semiconductor processing. These gain constants may change as processes change and as temperatures and voltages vary.

The data recovery phase locked loop system illustrated in FIG. 2 includes logic which may be used to account for the possibility that voltage controlled oscillator 58 runs at a harmonic of the incoming data, a condition that is undetectable by phase detectors used in data recovery loops.

Figure 1:
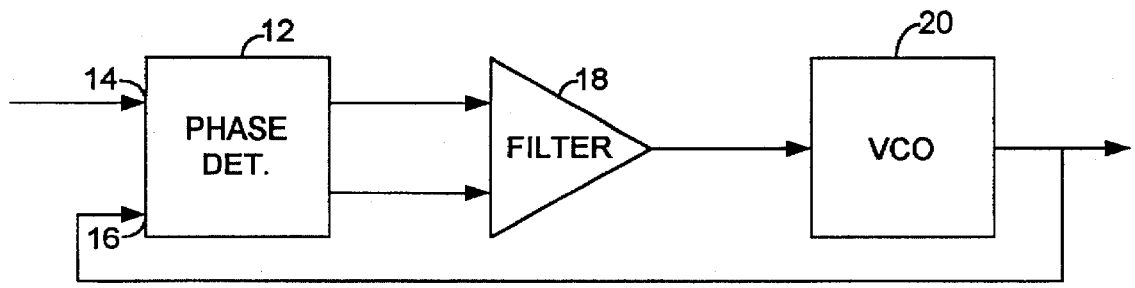
FIG. 1 is a block diagram of a Basic Clock Recovery Phase Locked Loop circuit.

Many methods of accounting for this condition are in common use, including dual linked voltage controlled oscillators, trimmed voltage controlled oscillators, and externally limited voltage controlled oscillator ranges. However, methods for detecting "unacceptable frequency behavior" are all additions to the basic function of the recovery PLL shown in FIG. 1. The one used in the present phase locked loop (FIG. 2) is simple and inexpensive to build and use.

In the normal operational mode of the present phase locked loop system 48, a voltage controlled oscillator feedback signal is compared with a reference timing signal (e.g., the signal from REFCLK divider 62) in voltage controlled oscillator divider 60 to determine if voltage controlled oscillator 58 is running within allowable limits. If it is not, an "out of lock" or other error indication will be asserted at the output of voltage controlled oscillator divider 60. Logic circuits (not shown) may then present the voltage input to the voltage controlled oscillator 58 to provide the desired operating frequency error indicator output. As long as voltage controlled oscillator 58 operates within acceptable limits, the out of lock indication is not asserted and phase locked loop system 48 tracks the incoming data.

Additional access points which may be added to the existing circuits are shown FIG. 2. Voltage stimulus input 64 may provide a test voltage to VCO 58. In some embodiments, a test voltage may already be available as an internal or external filter component. In cases where internal filter components are used, access to this point may be added.

Time stimulus input (TSI) 66 is located at a point where a digital input with an appropriate and/or predetermined pulse width may be applied. TSI 66 may also be provided by the timing signal (e.g., REFCLK 62). In some conventional products, TSI 66 is obtained by dividing the REFCLK signal by ad integer. If a more suitable input is desired, a multiplexer (not show) can be added and an external pin can supply the input required.

Monitor/output 68 is the point where the results of the measurement can be observed or displayed. In typical systems, this point is already part of the normal function of the circuit. An additional pad or test mode function may be needed to bring this node out to an accessible point. A conventional logic monitor of any type may be used. Any logical, observable output that reflect the state and timing of this node will be suitable.

The present invention allows a direct measurement of voltage controlled oscillator gain ($K_v$) using conventional automatic test equipment used to test digital logic or memory devices. Prior to the present invention, such testers have not had the ability to measure frequency directly, nor to respond to events that are not directly a result of stimulus that they generate, without the addition of external measurement components which increase the cost and maintenance overhead of the device and generally degrade test capacity. Logic testers have the ability to measure parameters that respond to stimulus generated by the tester. They can generate variable width pulses and can measure functionality and propagation delay at high speed and with good accuracy.

Testing for VCO gain using only a conventional tester is advantageously conducted by generating an analog voltage and measuring the resulting frequency.

In accordance with the present invention, the test system may apply a series of analog voltages to voltage stimulus input 64. For each analog voltage (VSI 64) the system applies a series of pulses to time stimulus input 66. By monitoring (a) the level on the monitor/output and (b) the time at which it switches, the VCO gain can be calculated. In effect, voltage controlled oscillator divider 60 may be used as a frequency counter in the test system. It counts voltage controlled oscillator cycles for a predetermined time, similar to a frequency counter.

The typical measurement procedure comprises measuring current or voltage/time pairs to characterize the transfer curve of the controlled oscillator, and then accepting or failing the test part based on its match to design expectations and predictions of phase locked loop performance using the measured VCO gain (i.e., determining whether the VCO gain is within or outside a particular threshold value). Preferably, in practice, phase locked loop can be tested using as little as a few well characterized points (e.g., ≧3 points where the gain ≠0).

As a result of this measurement, the tested part may be passed, binned or failed. Accessible control inputs, such as fuses or other circuit adjustment points, may be used to adjust the failed parts to conform to the required specification, and thus increase yield.

The gains of phase detector 50 and filter 56 can be adjusted in a conventional and relatively straight forward manner, thus providing an additional benefit for the present invention. For example, if the process offers a conventional fuse capability, it is possible to increase or decrease the gain of phase detector 50 or filter 56 to account for a gain error discovered in voltage controlled oscillator 58. This adjustment capability can be used as a trim feature for all die, or as a repair facility for only those wafers that are significantly different from nominal. The exact circuit providing this fuse repair function may vary with the design of the adjustable block.

The use of on-chip frequency counter logic to allow testing and characterization of production products, coupled with in-line repair of defective die, may increase the die yield without compromising the quality of the product, may minimize use of exotic and complex design techniques, and may allow production testing of sensitive analog parameters on a digital tester. Many types of counters can be used. Several different input and monitor points may be used to effect the same control. Many different fuse options are available to modify the various blocks. The present invention thus also concerns a combination of on-chip frequency counter logic (to assist external test equipment) and one or more programming fuses (to adjust PLL parameters). Accordingly, the present invention can increase the line yield of product (similar to RAM's and PLD's) and can minimize the expense of automatic test equipment for testing such exotic parameters.

The logic and/or programming aspect of the present invention may be conveniently implemented using a conventional general purpose digital computer programmed according to the teachings of the present specification, as will be apparent to those skilled in the relevant art(s). Appropriate software coding can readily be prepared by skilled programmers based on the teachings of the present disclosure, as will be apparent to those skilled in the relevant art(s).

The present invention may also be implemented by the preparation of application specific integrated circuits or by interconnecting an appropriate network of conventional component circuits as described herein, modifications of which will be readily apparent to those skilled in the relevant art(s).

The present invention thus also includes a computer program product which may comprise a storage medium including instructions which can be used to program a computer to perform a process according to the present invention. The storage medium can include, but is not limited to, any type of disk including floppy disks, optical disks, CD-ROMs, and magneto-optical disks, ROMs, RAMs, EPROMS, EEPROMs, magnet or optical cards, or any type of media suitable for storing electronic instructions.

While particular embodiments of the present invention have been illustrated and described, it is expected that numerous changes and modifications will occur to those skilled in the art, and it is intended in the appended claims to cover all those changes and modifications which fall within the spirit and scope of the present invention.

I claim:

1. A phase locked loop system having a detector, a filter and an oscillator along with a reference divider and a comparator having an input and an output comprising:

means for applying a test voltage at a first access node, located between the filter and the oscillator;

means for applying a digital input at an external pin between the reference divider and said comparator including means for applying a series of digital pulses;

means for providing a second input at said external pin comprising a multiplexer; and means for providing a measurable output connected to said comparator.

2. The phase locked loop circuit according to claim 1 wherein said means for applying a test voltage comprises a voltage stimulus input.

3. The phase locked loop circuit according to claim 2, wherein said voltage stimulus input includes a second access node connected to an output of the filter through a multiplexer.

4. The phase locked loop circuit according to claim 1 wherein said means for applying a digital input comprises a time stimulus input.

5. The phase locked loop circuit according to claim 4 wherein said time stimulus input includes means for providing a series of digital pulses for each analog voltage provided by said means for providing a series of analog voltages.

6. The phase locked loop circuit according to claim 1 wherein said means for applying a digital input includes means for providing a second input.

7. A method for measuring one or more internal parameters in a phase locked loop circuit (PLL), comprising the steps of:

applying a test input to the PLL;

presenting a digital signal having a predetermined pulse width to the PLL; and displaying an output from the PLL, wherein said digital signal is presented to a comparator in said PLL and said output is displayed from said comparator.

8. The method of claim 7, wherein said step of applying a test voltage comprises supplying a series of analog voltages.

9. The method of claim 7, wherein said step of presenting a digital signal comprises supplying a series of digital pulses for each analog voltage supplied.

10. A phase locked loop circuit comprising:

a detector having an detector input, a feedback input and one or more outputs capable of providing a phase difference signal in response to a phase difference between signals at said detector input and said feedback input;

a filter configured to receive said phase difference signal and to produce a correction signal, said filter having an output;

an oscillator capable of receiving said correction signal, providing said feedback signal, and providing an oscillator signal having a predetermined frequency;

a comparator having a first input configured to receive said oscillator signal and a second input configured to receive a reference signal, said comparator configured to generate an indication signal when said feedback signal and said reference signal have different frequencies;

a voltage stimulus input between said filter and said oscillator, wherein said voltage stimulus input (a) has a first access node connected to said filter output and (b) is capable of applying a test voltage; and a second access node configured to present a time stimulus input comprising a series of digital pulses with a predetermined pulse width to said second input of said comparator.

11. The phase locked loop circuit according to claim 10, further comprising:

a reference divider configured to receive said reference signal and to generate a modified reference signal at said second input of said comparator.

12. The phase locked loop circuit according to claim 11 wherein said first access node provides a series of analog voltages.

13. The phase locked loop circuit according to claim 12 further comprising a multiplexer configured to receive inputs from a plurality of additional access nodes, each configured to apply additional analog voltages to said voltage stimulus.

* * * * *